United States Patent [19]

Gonin et al.

[11] 4,356,463
[45] Oct. 26, 1982

[54] FILTERING DEVICE USING THE TRANSFER OF ELECTRICAL CHARGES INTO A SEMICONDUCTOR

[75] Inventors: Roger B. Gonin; Daniel Forster; Jean E. Picquendar, all of Paris, France

[73] Assignee: Thomson-CSF, Paris, France

[21] Appl. No.: 96,328

[22] Filed: Nov. 21, 1979

[30] Foreign Application Priority Data

Nov. 21, 1978 [FR] France ............................ 78 32765

[51] Int. Cl.³ ...................... H03H 15/02; G11C 27/02
[52] U.S. Cl. .............................. 333/165; 307/221 D; 333/166
[58] Field of Search .................... 333/165, 166, 173; 357/24; 328/167; 307/221 R, 221 C, 221 D

[56] References Cited

U.S. PATENT DOCUMENTS

| | | | |
|---|---|---|---|
| 3,953,745 | 4/1976 | Bailey | 333/165 X |
| 4,099,197 | 7/1978 | Ibrahim et al. | 333/165 X |
| 4,195,273 | 3/1980 | Prince | 333/165 |
| 4,205,283 | 5/1980 | Donnally, Jr. | 333/166 X |
| 4,246,553 | 1/1981 | Pfleiderer | 333/165 |

OTHER PUBLICATIONS

Caves—"Sampled Analog Filtering Using Switched Capacitors as Resistance Equivalents", IEEE Journal of Solid-State Circuits, vol. SC-12, No. 6, Dec. 1977, pp. 592-608.
Puckette et al.—"Bucket-Brigade Transversal Filters" IEEE Transactions on Circuits and Systems, vol. CA-S-21, No. 4, Jul. 1974; pp. 502-510.

Primary Examiner—Marvin L. Nussbaum
Attorney, Agent, or Firm—Roland Plottel

[57] ABSTRACT

Two analog filters of the second order are arranged in series with a transverse charge transfer filter upstream and downstream of the latter. The analog filters are switched capacitor filters having an amplifier and a network of capacitors and MOS transistors. The filtering device is entirely integrated onto the same semiconductor substrate.

10 Claims, 7 Drawing Figures

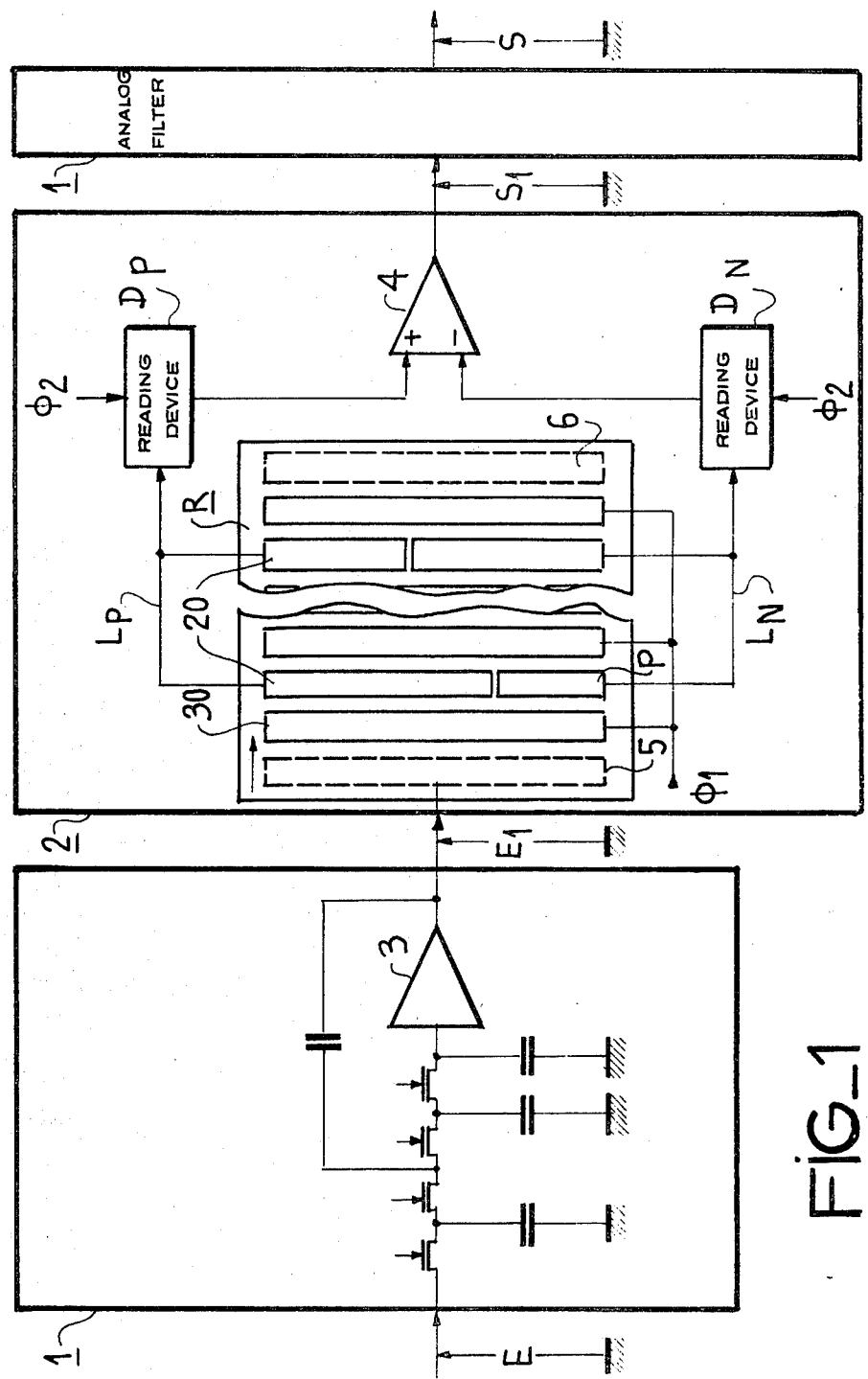
FIG_1

FIG_2
(a)
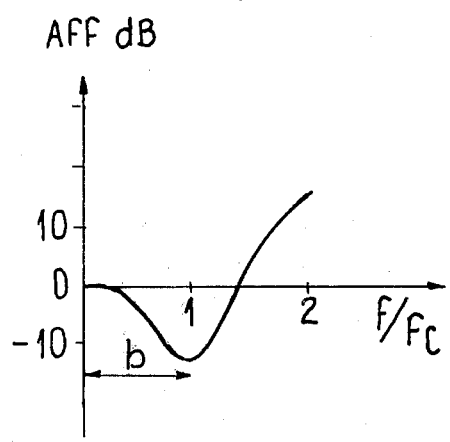
(b)
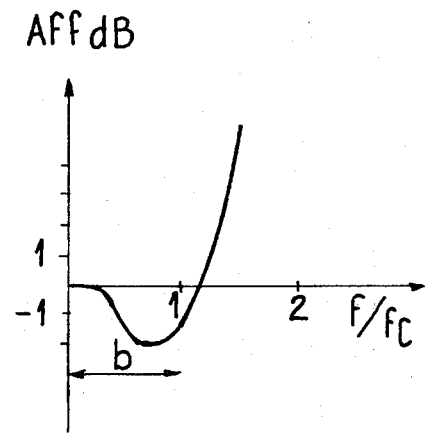
(c)
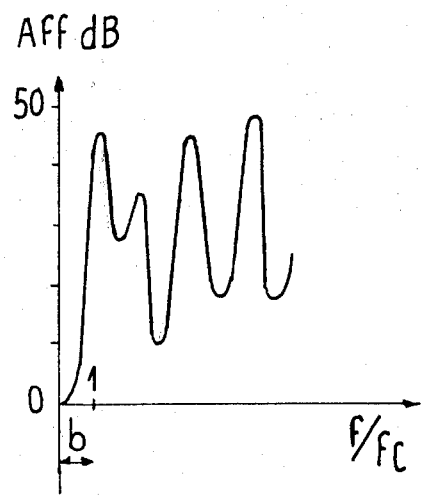
(d)
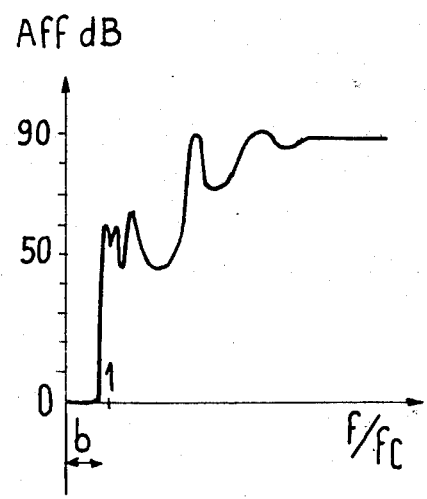

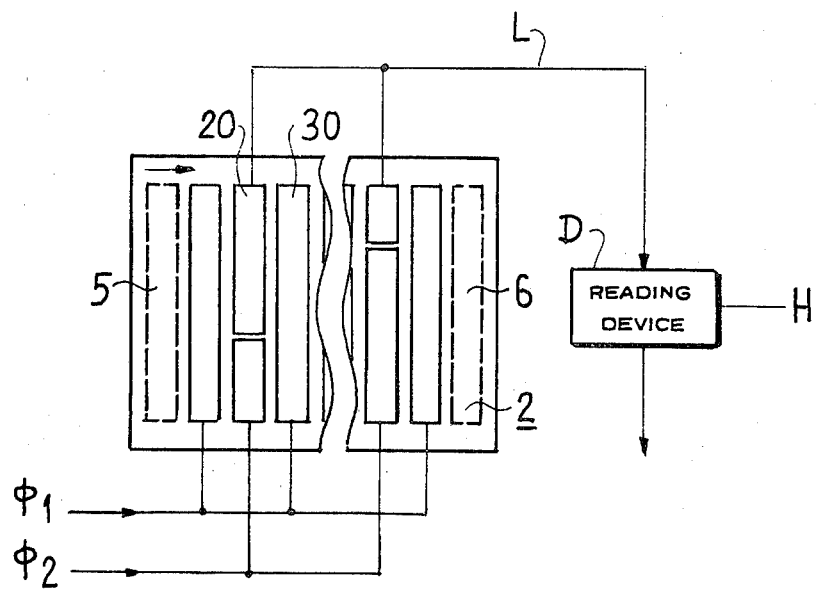
FIG_3
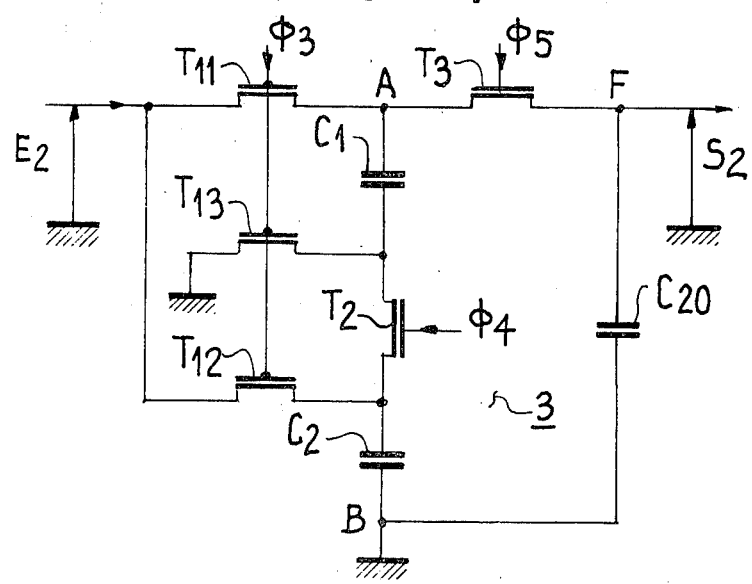
FIG_4

FILTERING DEVICE USING THE TRANSFER OF ELECTRICAL CHARGES INTO A SEMICONDUCTOR

BACKGROUND OF THE INVENTION

The present invention relates to a filtering device using the transfer of electrical charges into a semiconductor.

It is pointed out that a transverse charge transfer filter such as that used in the filtering device according to the invention is generally constituted by:

an electrical charge transfer shift register on a semiconductor substrate covered by an insulating layer on which are arranged transfer electrodes, positioned parallel to one another and positioned transversely with respect to the direction of the charges. On the periodic application of given potentials these electrodes ensure the transfer into the substrate from one stage of the register into the next of groups of charges corresponding to samples of the input signal to be filtered.

weighting means connected to the output of the stages of the shift register which allocate a weighting coefficient to the quantity of charges having passed through each stage.

The quantities of weighted charges are generally read differentially and this differential signal constitutes the electrical output signal of the device.

Transverse charge transfer filters are more particularly used as low-pass and band-pass filters. When it is desired to obtain a precisely defined frequency response curve from these filters, more particularly with respect to the attenuation provided by the filter in a given frequency band and outside this band, with respect to the residual ripple in the pass band, and to the slope of the transition zone towards the pass band, it is necessary to greatly increase the number of weighting coefficients and therefore the number of stages in the shift register. Thus, a transverse charge transfer filter with 500 stages has been described in an article in the American Journal "I.E.E.E. Journal of Solid-State Circuits", Volume SC 11, pp. 75 to 84 of February 1976.

The most important disadvantage of transverse charge transfer filters is their overall dimensions. It should also be noted that when the number of stages becomes large and specifically when it exceeds 50, the performances obtained with these filters no longer correspond to those which could be expected on the basis of theoretical considerations only.

BRIEF SUMMARY OF THE INVENTION

The present invention relates to a filtering device using the transfer of electrical charges into a semiconductor having at least one analog filter of at least the second order in series with a transverse charge transfer filter, the analog filter or filters contributing to reducing within a given frequency band the attenuation produced by the charge transfer filter at its sampled input voltage in such a way that in this frequency band the attenuation of the filtering device Att=20 log$_{10}(E/S)$, E and S being the input and output voltages of the device, is substantially zero and contributing to the increase, outside said frequency band, of the attenuation provided by the charge transfer filter at its sampled input voltage in such a way that outside this frequency band the attenuation of the device is very high.

The transverse charge transfer filter is constituted by:

a charge transfer shift register having a plurality of stages, said register being on a semiconductor substrate covered with an insulating layer, transfer electrodes constituting these stages being placed on the insulating layer parallel to one another and transversely positioned with respect to the direction of the charges and ensuring the transfer of charges into the substrate from one stage of the register to the next in the case of the periodic application of given potential;

means ensuring the injection of charges corresponding to the sampled input voltage of the charge transfer filter;

weighting means connected to the output of the stages of the register allocating a weighting coefficient to the quantity of charges having passed through each stage;

means fixing the sign of the weighting coefficients;

summation and reading means for the quantities of weighted charges, said means supplying the electrical output signal of the charge transfer filter;

means ensuring the discharge of the charges having passed through the final stage of the register.

According to one of the preferred embodiments of the invention, the analog filters are commutated capacitor filters, each having one or more amplifiers comprising solely capacitors MOS transistors operating in commutation, whilst the transverse charge transfer filter has only positive weighting coefficients and has no differential amplifier.

The transfer function of a transverse charge transfer filter only has transmission zeros and no poles.

When at least one analog filter of at least the second order is arranged in series with a transverse filter it introduces pairs of poles making it possible to reduce the number of zeros required for bringing about filtration with the transverse filter only. Therefore, the number of stages of the transverse filter can be reduced.

The present invention has the following particular advantages:

it reduces the number of stages of the transverse charge transfer filter when carrying out a given filtering operation, so that the results obtained in practice coincide with those of theory and are also highly satisfactory;

it reduces the overall dimensions of the device, particularly in the embodiment where the analog filters are switched capacitor filters having amplifiers constituted solely by MOS transistors and capacitors and in which the transverse charge transfer filter has only positive weighting coefficients and consequently has no differential amplifier, said embodiment being eminently suitable for the integration of the complete device on one and the same semiconductor substrate.

When a charge transfer filter with positive coefficients is used, the invention leads to better filtering performances from the standpoint of linearity of transfer, noise produced by the filtering device and the dynamics obtained for a given harmonic content.

BRIEF DESCRIPTION OF THE DRAWINGS

The invention will be described in greater detail hereinafter relative to exemplified and non-limitative embodiments and with reference to the attached drawings, wherein show:

FIG. 1 an embodiment of the device according to the invention, as well as an embodiment of a transverse charge transfer filter and an analog filter of the second order.

FIGS. 2a, b, c, d curves diagrammatically showing as a function of the frequency ratio $f/f_c$ the variations in the attenuation provided by two analog filters, a transverse charge transfer filter and a device according to the invention having said two analog filters in series with the charge transfer filter.

FIG. 3 an embodiment of a transverse charge transfer filter with positive weighting coefficients.

FIG. 4 an embodiment of an amplifier used in an analog filter with switched capacitors.

DETAILED DESCRIPTION OF THE PREFERRED EMBODIMENTS

FIG. 1 shows an embodiment of the device according to the invention. Two analog filters 1 are mounted in series with a transverse charge transfer filter 2 upstream and downstream thereof. In FIG. 1, two analog filters 1 are shown, but the invention is also applicable to cases where one or more analog filters are arranged in series with a transverse charge transfer filter. In the same way, the invention covers all the relative positioning arrangements of the charge transfer filter and of the analog filter or filters.

The analog filters must be at least of the second order in order to be able to reduce the attenuation provided by the charge transfer filter to its sampled input voltage $E_1$ in a given frequency band. The attenuation Att is, by definition, equal to 20 log$_{10}$ (input voltage/output voltage). It is pointed out that an analog filter, comprising in per se known manner a network of resistors, reactors and capacitors, processes an analog signal and that digital filters, such as charge transfer filters, process samples of the analog signal to be filtered. The analog filters can also be produced by combining one or more active amplifiers using bipolar or MOS transistors and networks of resistors and capacitors. Each resistor can also be replaced by a combination of two MOS transistors operating in commutation and one capacitor, the thus obtained filters being called switched capacitor filters. Such filters have been described in the American Journal "I.E.E.E. Journal of Solid-State Circuits" Vol. SC 12, No. 6, December 1977, pp. 592 to 608. FIG. 1 shows a way in which it is possible to produce an analog filter 1 of the second order with switched capacitors. It comprises an amplifier 3 and a network of capacitors and MOS transistors, represented in exemplified manner. FIG. 1 also shows an embodiment of a transverse charge transfer filter 2. In the latter, the weighting means are constituted by weighting electrodes 20 interposed with transfer electrodes 30 on shift register R. Each weighting electrode is divided up into at least two elementary electrodes separated in the charge transfer direction by a break, so that a quantity of weighted charges can be collected underneath each elementary electrode. In exemplified manner in FIG. 1 a single transfer electrode is placed between each weighting electrode and each weighting electrode is subdivided into two elementary electrodes. In FIG. 1, the reading means are constituted in per se known manner by two current or voltage charge reading devices $D_P$ and $D_N$. These devices carry out the output voltage charges conversion and are coupled to two collecting lines $L_P$ and $L_N$ for the quantities of weighted charges of two elementary electrodes of each weighting electrode. The means fixing the sign of the weighting coefficients and the means for summating the weighted charge quantities comprise a differential amplifier 4 of unity gain receiving the signals from the charge reading devices and supplying the output signal $S_1$ of the charge transfer filter. The transfer and weighting electrodes ensure the transfer of charges into the substrate in the case of a periodic application of given potentials, respectively $\phi_1$ and $\phi_2$. Potential $\phi_2$ can be applied to the elementary electrodes under which the charges are sampled by means of the reading devices $D_P$ and $D_N$. The charge injections and discharge means are symbolically represented and designated by the reference numerals 5 and 6.

FIGS. 2a, b, c, d show curves diagrammatically representing variations in the attenuation provided by two analog filters, a transverse charge transfer filter and a device according to the invention which has said two filters in series with the charge transfer filter, as a function of the ratio $f/f_c$, f being the operating frequency and $f_c$ the cutoff frequency of the device.

In the frequency band b of FIGS. 2a and b, the analog filters reduce the attenuation provided by the charge transfer filter to its sampled input voltage in FIG. 2c. Thus, the device according to the invention has an attenuation $Att = 20 \log_{10}(E/S)$ E and S being the input and output voltages of the device, which is substantially zero in the band b in FIG. 2d. Outside band b, the analog filters increase the attenuation due to the transverse charge transfer filter. Outside band b the attenuation of the device is very high and exceeds 40 decibels.

FIG. 3 shows an embodiment of a transverse charge transfer filter with positive weighting coefficients. A quantity of weighted charges is collected beneath one of the elementary electrodes of each weighting electrodes 20 by means of a collecting line L, constituting the summation means of the transverse filter. The reading means of the quantities of electrical charges and the means fixing the sign of the weighting coefficients are constituted by a current or voltage charge reading device D, coupled to the collecting line and supplying the electrical output signal of the filter.

Device D receives a clock signal H of the same frequency as the signal $\phi_1$ and $\phi_2$.

A transverse charge transfer filter with positive weighting coefficients has the advantage of not having a differential amplifier, which is always difficult to integrate.

FIG. 4 shows an embodiment of the amplifier which can be used in an analog filter of switched capacitors, such as amplifier 3 shown in FIG. 1. In the embodiment of FIG. 4, the amplifier gain approximatively equals 2. This amplifier has two capacitors $C_1$ and $C_2$, which are periodically switched in parallel and in series by MOS transistors operating in commutation. The same voltage $E_2$ simultaneously charges the parallel-switched capacitors and an amplified voltage is obtained between the extreme terminals A and B of the series-switched capacitors. The two capacitors are commutated in parallel by MOS transistors $T_{11}$ and $T_{12}$ connected by their drain and their sources between on the one hand the extreme terminal A of capacitor $C_1$ and one terminal of capacitor $C_2$ other than the extreme terminal B and on the other hand the input to which is applied a voltage $E_2$, and by the MOS transistor $T_{13}$, connected by its drain and its source between one terminal of capacitor $C_1$ other than extreme terminal A and earth. Extreme terminal B is directly connected to earth. The two capacitors are commutated in series by an MOS transistor $T_2$ connected by its drain and source between the terminals of two capacitors, other than the extreme terminals A and B. The two groups of MOS transistors $T_{11}$, $T_{12}$, $T_{13}$ and $T_2$ are controlled by periodic signals $\phi_3$ and $\phi_4$ applied to their grids in such a way that the groups are not simultaneously conductive.

A MOS transistor $T_3$, controlled in commutation by a periodic signal $\phi_5$ applied to its grid can be connected by its drain and its source between the extreme terminal A and a point F. Transistors $T_3$ is made conductive during the time interval when the capacitors are switched in series by signal $\phi_4$ in order to permit the transfer of the amplified voltage from terminal A to point F. A capacitor $C_{20}$ can be connected between point F and earth. It makes it possible to maintain the amplified voltage $S_2$ at point F and the adjustment of the amplifier gain. In the case where the two capacitors have the same values C the voltage $S_2$ at F after the conduction of $T_3$ can be written:

$$S_2 = E_2 \cdot \frac{2}{1 + 2 \cdot \frac{C_{20}}{C}}$$

It is easily possible to obtain an amplifier of gain greater than 2 by increasing the number of capacitors to be switched, such as $C_1$ and $C_2$ in FIG. 4, and the number of transistors, such as $T_2$, $T_{11}$, $T_{12}$, $T_{13}$ which realize the switching.

A switched capacitor amplifier such as that described hereinbefore can easily be integrated onto the same semiconductor substrate, because it solely comprises MOS transistors and capacitors. A switched capacitor filter having one or more switched capacitor amplifiers can therefore be easily integrated. Another advantage of switched capacitor amplifiers is their very stable, well defined gain and their low consumption.

The two capacitors $C_1$ and $C_2$ of the switched capacitor amplifier can be identical with one of the capacitors belonging to the network of capacitors and MOS transistors connected to each amplifier.

The amplifier shown in FIG. 4 can be completed by a follower system, constituted for example by a single transistor or by a looped differential amplifier.

The device according to the invention can be entirely integrated onto the same semiconductor substrate in embodiments where the analog filters are integratable.

The integration of the complete device onto the same substrate is made more easy because the transverse charge transfer device has positive weighting coefficients and the analog filters are commutated capacitor filters having commutated capacitor amplifiers.

Any device differing from those illustrated by the embodiment of the analog filter or filters or by the embodiment of the transverse charge transfer filter, particularly with respect to the transfer electrodes inserted between each weighting electrode and the number of elementary electrodes constituting each weighting electrode does not pass beyond the scope of the invention. The device according to the invention is used for filtering electrical signals.

What is claimed is:

1. A filtering device using the transfer of electrical charges into a semiconductor, comprising at least one analog filter of at least the second order in series with a transverse charge transfer filter constituted by:

a charge transfer shift register having a plurality of stages, said register being on a semiconductor substrate covered with an insulating layer, transfer electrodes constituting these stages being placed on the insulating layer parallel to one another and transversely positioned with respect to the direction of the charges and ensuring the transfer of charges into the substrate from one stage of the register to the next in the case of the periodic application of given potential;

means for the injection of charges corresponding to the sampled input voltage of the charge transfer filter;

weighting means connected to the output of the stages of the register allocating a weighting coefficient to the quantity of charges having passed through each stage;

means fixing the sign of the weighting coefficients;

summation and reading means for the quantities of weighted charges, said means supplying the electrical output signal of the charge transfer filter;

means ensuring the discharge of the charges having passed through the final stage of the register; wherein the analog filter or filters cooperate with the charge transfer filter contributing to reducing the attenuation produced by the charge transfer filter at its sampled input voltage in such a way that in its useful frequency band the attenuation of the filtering device is substantially zero, with Att=20 $\log_{10}(E/S)$, E and S being the input and output voltages of the device, and said analog filter or filters cooperate with the charge transfer filter contributing to the increase, outside said frequency band, of the attenuation provided by the charge transfer filter at its sampled input voltage in such a way that outside this frequency band the attenuation of the filtering device is very high.

2. A device according to claim 1, wherein the weighting means are constituted by weighting electrodes interposed with the transfer electrodes on the charge transfer register, each weighting electrode being subdivided into at least two elementary electrodes separated in the charge transfer direction by a break, a quantity of weighted charges being collectable beneath each elementary electrode, the transfer and weighting electrodes ensuring the transfer of charges into the substrate in the case of a periodic application of given potentials.

3. A device according to claim 2, wherein the reading means are constituted by two charge reading devices coupled to two collecting lines for the quantities of weighted charges of two elementary electrodes of each weighting electrode and wherein the means fixing the sign of the weighting coefficients and the means for summating the quantities of weighted charges comprise a differential amplifier of unity gain receiving the signals from the charge reading devices and supplying the electrical output signal of the charge transfer filter.

4. A device according to claim 2, wherein the charge transfer filter has positive weighting coefficients, the algebraic summation means being constituted by a collecting line for the quantities of weighted charges from one elementary electrode of each weighting electrode, the means for reading the quantities of electrical charges and the means fixing the sign of the weighting coefficients being constituted by a charge reading device coupled to the collecting line and supplying the electrical output signal of the filter.

5. A device according to claim 1, wherein at least one analog filter is a switched capacitor filter, constituted by at least one amplifier, and a network of capacitors and MOS transistors functioning in commutation, which is connected to each amplifier.

6. A device according to claim 5, wherein each amplifier has capacitors, periodically switched in parallel and in series by MOS transistors operating in commutation, the same voltage simultaneously charging the parallel-switched capacitors and an amplified voltage being obtained between the extreme terminals of the series-switched capacitors, the capacitors being switched in parallel by MOS transistors connected by their drain and their source between on the one hand one of the terminal of each capacitor among which the extreme terminal of the first capacitor and on the other hand the input to which is applied a voltage, and by MOS transistors connected by their drains and sources between the other terminal of each capacitor and earth, the extreme terminal of the last capacitor being directly connected to earth, the capacitors being switched in series by MOS transistors connected by their drains and their sources between the terminals of capacitors other than the extreme terminals, the two groups of MOS transistors ensuring the commutation in parallel and in series being controlled by periodic signals applied to their grids and such that the two groups are not simultaneously conductive, whereby said amplifier can be entirely integrated onto the same semiconductor substrate.

7. A device according to claim 6, wherein one MOS transistor is connected by its drain and its source between the extreme terminal of the first capacitor and a point and wherein a capacitor is connected between said point and earth, the MOS transistor functioning in commutation and being controlled by a periodic signal applied to its grid, the transistor being rendered conductive during the time interval when the capacitors are commutated in series in order to permit the transfer of the amplified voltage from the extreme terminal of the first capacitor to the said point, the capacitor making it possible to maintain the amplified voltage at said point and the adjustment of the amplifier gain.

8. A device according to claim 6, wherein the two capacitors of the amplifier are identical with a capacitor belonging to the network of capacitors and MOS transistors connected to each amplifier.

9. A device according to claim 1, wherein said transversal charge transfer filter has positive weighing coefficients and said analog filters are switched capacitor filtrs having switched capacitor amplifiers.

10. A device according to claim 9 wherein said device is entirely integrated on the same semiconductor substrate.

* * * * *